(12) United States Patent
Yamada

(10) Patent No.: US 12,316,289 B2
(45) Date of Patent: May 27, 2025

(54) POWER AMPLIFYING CIRCUIT

(71) Applicant: Murata Manufacturing Co., Ltd., Kyoto (JP)

(72) Inventor: Takashi Yamada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 538 days.

(21) Appl. No.: 17/659,725

(22) Filed: Apr. 19, 2022

(65) Prior Publication Data

US 2022/0337209 A1 Oct. 20, 2022

(30) Foreign Application Priority Data

Apr. 20, 2021 (JP) ................................. 2021-071181

(51) Int. Cl.
| | |
|---|---|
| H03F 3/68 | (2006.01) |
| H03F 3/19 | (2006.01) |
| H03F 3/193 | (2006.01) |
| H03F 3/21 | (2006.01) |
| H03G 3/30 | (2006.01) |
| H03F 3/60 | (2006.01) |

(52) U.S. Cl.
CPC ........... H03G 3/3036 (2013.01); H03F 3/193 (2013.01); H03F 3/21 (2013.01); *H03F 3/211* (2013.01); *H03F 3/602* (2013.01)

(58) Field of Classification Search
CPC ........... H03G 3/3036; H03G 2201/103; H03G 2201/206; H03G 2201/307; H03G 2201/40; H03G 2201/504; H03F 3/193; H03F 3/21; H03F 2200/408; H03F 3/211; H03F 3/50; H03F 1/0266; H03F 3/245; H03F 1/302; H03F 3/19; H03F 3/68; H03F 3/602; H03F 3/195; H03F 1/0288
USPC ............................................. 330/124 R, 295
See application file for complete search history.

(56) References Cited

U.S. PATENT DOCUMENTS 10,924,067 B2 *  2/2021  Honda ....................... H03F 3/21

FOREIGN PATENT DOCUMENTS

JP           2006-191332 A        7/2006

* cited by examiner

*Primary Examiner* — Khanh V Nguyen
(74) *Attorney, Agent, or Firm* — McDonald Hopkins LLC

(57) ABSTRACT

A power amplifying circuit includes multi-stage power amplifiers, bias circuits, and a control circuit. The bias circuits output corresponding bias currents based on corresponding control currents. The control circuit outputs the control currents to the bias circuits based on a control voltage. The power amplifiers include a first stage of first and second power amplifiers connected in parallel electrically. The bias circuits include first and second bias circuits. The control circuit includes first and second current output units. The first current output unit outputs, to the first bias circuit, a first control current which has a first current value when the control voltage is a first threshold voltage, and which increases linearly with the control voltage, and the second current output unit outputs, to the second bias circuit, a second control current, having a second constant current value, when the control voltage is the first threshold voltage or greater.

8 Claims, 13 Drawing Sheets

POWER AMPLIFYING CIRCUIT

CROSS REFERENCE TO RELATED APPLICATION

This application claims priority from Japanese Patent Application No. 2021-071181 filed on Apr. 20, 2021. The content of this application is incorporated herein by reference in its entirety.

BACKGROUND OF THE DISCLOSURE

1. Field of the Disclosure

The present disclosure relates to a power amplifying circuit.

2. Description of the Related Art

For example, the gains of power amplifying circuits are controlled through control voltages in Gaussian filtered minimum shift keying (GMSK) transmission mode of global system for mobile communications (GSM).

Japanese Unexamined Patent Application Publication No. 2006-191332 describes a radio-frequency power amplifying circuit that supplies a bias current, which is proportional to a control voltage, to a first amplifier and that supplies a bias current, which is proportional to the square of the control voltage, to a second amplifier.

The radio-frequency power amplifying circuit described in Japanese Unexamined Patent Application Publication No. 2006-191332 causes dependency of a radio-frequency output signal on a radio-frequency input signal and a slope to be increased when the radio-frequency output signal is low-power. In the present disclosure, the slope refers to the rate of change of the gain with respect to the control voltage.

BRIEF SUMMARY OF THE DISCLOSURE

The present disclosure is made in view of the issue described above, and an object thereof is to decrease the dependency of a radio-frequency output signal on a radio-frequency input signal and the slope.

A power amplifying circuit according to an aspect of the present disclosure includes multiple power amplifiers, multiple bias circuits, and a control circuit. The power amplifiers are connected in stages. The bias circuits output multiple bias currents to the respective power amplifiers based on corresponding control currents. The control circuit outputs the control currents to the bias circuits based on a control voltage. The power amplifiers include a first stage of a first power amplifier and a second power amplifier that are connected in parallel electrically. The bias circuits include a first bias circuit that outputs a first bias current to the first power amplifier based on a first control current, and a second bias circuit that outputs a second bias current to the second power amplifier based on a second control current. The control circuit includes a first current output unit and a second current output unit. The first current output unit outputs the first control current to the first bias circuit. The first control current has a first current value when the control voltage is a first threshold voltage. The first control current increases linearly in accordance with the control voltage when the control voltage is greater than the first threshold voltage. The second current output unit outputs the second control current to the second bias circuit. The second control current has a second constant current value when the control voltage is equal to or greater than the first threshold voltage.

The present disclosure enables the dependency of a radio-frequency output signal on a radio-frequency input signal and the slope to be decreased.

DETAILED DESCRIPTION OF THE DISCLOSURE

Embodiments of a power amplifying circuit provided by the present disclosure will be described in detail below on the basis of the drawings. The embodiments do not limit the present disclosure. The embodiments are exemplary. Needless to say, partial replacement or combination of configurations in different embodiments may be made. In a second embodiment and its subsequent embodiments, points common to those in a first embodiment will not be described, and only different points will be described. In particular, substantially the same operation and effect of substantially the same configuration of the embodiments will not be described repeatedly.

First Embodiment and Comparison Example

Circuit Configuration

Figure 1:
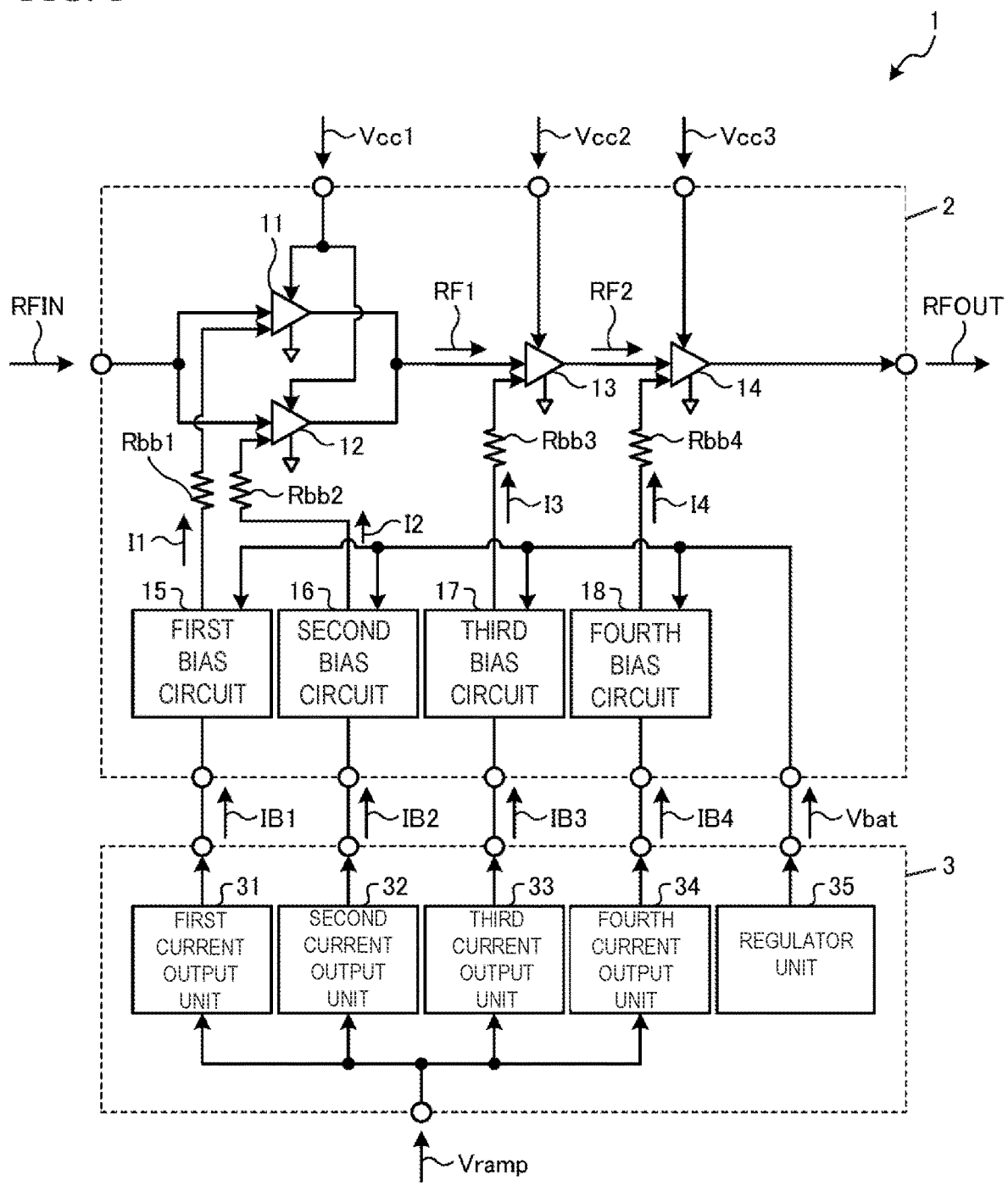
FIG. 1 is a diagram illustrating the configuration of a power amplifying circuit according to a first embodiment.

FIG. 1 is a diagram illustrating the configuration of a power amplifying circuit according to the first embodiment. A power amplifying circuit 1 amplifies a radio-frequency input signal RFIN to output a radio-frequency output signal RFOUT. The power amplifying circuit 1 includes a first semiconductor chip 2 and a second semiconductor chip 3.

The first semiconductor chip 2 includes first to fourth power amplifiers 11 to 14, first to fourth bias circuits 15 to 18, and first to fourth resistors Rbb1 to Rbb4.

The second semiconductor chip 3 includes first to fourth current output units 31 to 34 (e.g., circuits) and a regulator unit 35.

The first current output unit 31 receives a control voltage Vramp. The control voltage Vramp is a voltage for controlling the gain of the power amplifying circuit 1. The first current output unit 31 outputs a first control current IB1 to the first bias circuit 15 on the basis of the control voltage Vramp.

The second current output unit 32 receives the control voltage Vramp. The second current output unit 32 outputs a second control current IB2 to the second bias circuit 16 on the basis of the control voltage Vramp.

The third current output unit 33 receives the control voltage Vramp. The third current output unit 33 outputs a third control current IB3 to the third bias circuit 17 on the basis of the control voltage Vramp.

The fourth current output unit 34 receives the control voltage Vramp. The fourth current output unit 34 outputs a fourth control current IB4 to the fourth bias circuit 18 on the basis of the control voltage Vramp.

The regulator unit 35 outputs a power supply voltage Vbat to the first to fourth bias circuits 15 to 18. The first to fourth bias circuits 15 to 18 operate with supply of the power supply voltage Vbat from the regulator unit 35.

The first bias circuit 15 outputs a first bias current I1 to the first power amplifier 11 through the first resistor Rbb1 on the basis of the first control current IB1.

The second bias circuit 16 outputs a second bias current I2 to the second power amplifier 12 through the second resistor Rbb2 on the basis of the second control current IB2.

The third bias circuit 17 outputs a third bias current I3 to the third power amplifier 13 through the third resistor Rbb3 on the basis of the third control current IB3.

The fourth bias circuit 18 outputs a fourth bias current I4 to the fourth power amplifier 14 through the fourth resistor Rbb4 on the basis of the fourth control current IB4.

Figure 2:
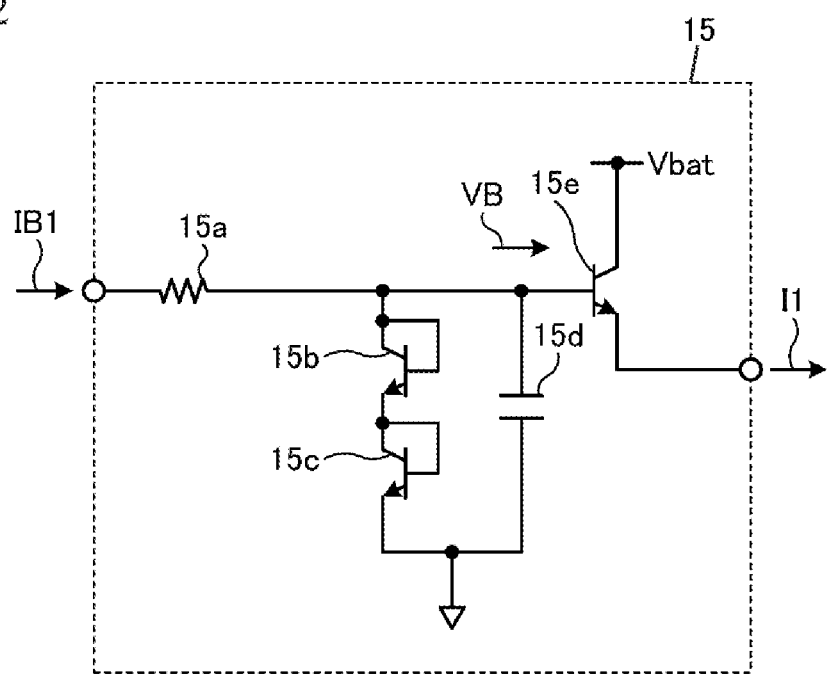
FIG. 2 is a diagram illustrating the circuit configuration of a first bias circuit of a power amplifying circuit according to the first embodiment.

FIG. 2 is a diagram illustrating the circuit configuration of a first bias circuit of a power amplifying circuit according to the first embodiment. FIG. 2 describes the circuit configuration of the first bias circuit 15. The circuit configurations of the second to fourth bias circuits 16 to 18 are substantially the same as that of the first bias circuit 15, and will be neither illustrated nor described.

The first bias circuit 15 includes a resistor 15a and transistors 15b, 15c, and 15e, and a capacitor 15d.

In the present disclosure, the transistors are bipolar transistors. However, the present disclosure is not limited to this. The bipolar transistors are illustrated as heterojunction bipolar transistors (HBTs). The present disclosure is not limited to this. For example, the transistors may be field effect transistors (FETs). The transistors may be multi-finger transistors each having multiple unit transistors connected in parallel electrically. A unit transistor refers to the minimum configuration of a transistor.

The resistor 15a receives the first control current IB1 at its first end.

In the transistor 15b, the collector and the base are connected to each other electrically. That is, the transistor 15b is diode connected. In the transistor 15b, the collector and the base are connected to a second end of the resistor 15a electrically.

In the transistor 15c, the collector and the base are connected to each other electrically. That is, the transistor 15c is diode connected. In the transistor 15c, the collector and the base are connected to the emitter of the transistor 15b electrically. The transistor 15c is connected, at its emitter, to the reference potential electrically.

The series-connected circuit of the transistors 15b and 15c generates a certain potential VB in accordance with the first control current IB1.

The capacitor 15d is connected, at its first end, to the collector and the base of the transistor 15b electrically. The capacitor 15d is connected, at its second end, to the reference potential electrically. The capacitor 15d stabilizes the potential VB.

The transistor 15e is connected, at its base, to the first end of the capacitor 15d electrically, and receives the potential VB at its base. The transistor 15e is connected, at its collector, to the power supply voltage Vbat electrically. The transistor 15e is connected, at its emitter, to the first resistor Rbb1 (see FIG. 1) electrically. That is, the transistor 15e functions as an emitter-follower.

The transistor 15e outputs the first bias current I1 to the first power amplifier 11 (see FIG. 1) through the first resistor Rbb1 in accordance with the potential VB.

Referring to FIG. 1 again, the first power amplifier 11 and the second power amplifier 12 receive a power supply voltage Vcc1. The first power amplifier 11 and the second power amplifier 12 operate with supply of the power supply voltage Vcc1.

The third power amplifier 13 receives a power supply voltage Vcc2. The third power amplifier 13 operates with supply of the power supply voltage Vcc2.

The fourth power amplifier 14 receives a power supply voltage Vcc3. The fourth power amplifier 14 operates with supply of the power supply voltage Vcc3.

The power supply voltages Vcc1, Vcc2, and Vcc3 may be different from each other or may be the same.

The first power amplifier 11 and the second power amplifier 12 are connected to each other in parallel electrically. In the present disclosure, the first power amplifier 11 and the second power amplifier 12 have a common connection, at their inputs, to the same node electrically. The first power amplifier 11 and the second power amplifier 12 have a common connection, at their outputs, to the same node electrically. The first power amplifier 11 and the second power amplifier 12 receive the radio-frequency input signal RFIN at their input terminals. The first power amplifier 11 and the second power amplifier 12 amplify the radio-frequency input signal RFIN to output a radio frequency signal RF1.

The third power amplifier 13 is connected, at its input terminal, to the output terminals of the first power amplifier 11 and the second power amplifier 12 electrically. The third power amplifier 13 amplifies the radio frequency signal RF1 to output a radio frequency signal RF2.

The fourth power amplifier 14 is connected, at its input terminal, to the output terminal of the third power amplifier 13 electrically. The fourth power amplifier 14 amplifies the radio frequency signal RF2 to output the radio-frequency output signal RFOUT.

That is, the first to fourth power amplifiers 11 to 14 are connected in multiple stages (in this example, three stages).

The first power amplifier 11 and the second power amplifier 12 correspond to the first-stage (driver-stage) power amplifier.

The third power amplifier 13 corresponds to the second-stage (middle-stage) power amplifier.

The fourth power amplifier 14 corresponds to the third-stage (power-stage) power amplifier.

In the first embodiment, it is assumed that (the gain at the first stage)<(the gain at the second stage)<(the gain at the third stage). However, the present disclosure is not limited to this.

In the first embodiment, it is assumed that the first-stage power amplifier includes two power amplifiers (the first power amplifier 11 and the second power amplifier 12) which are connected in parallel electrically. However, the present disclosure is not limited to this. The first-stage power amplifier may include three or more power amplifiers connected in parallel electrically.

In the first embodiment, multiple power amplifiers are connected in three stages. However, the present disclosure is not limited to this. Multiple power amplifiers may be connected in two stages or in four or more stages. In either case, any configuration may be employed as long as the first-stage power amplifier includes two or more power amplifiers connected in parallel electrically.

Figure 3:
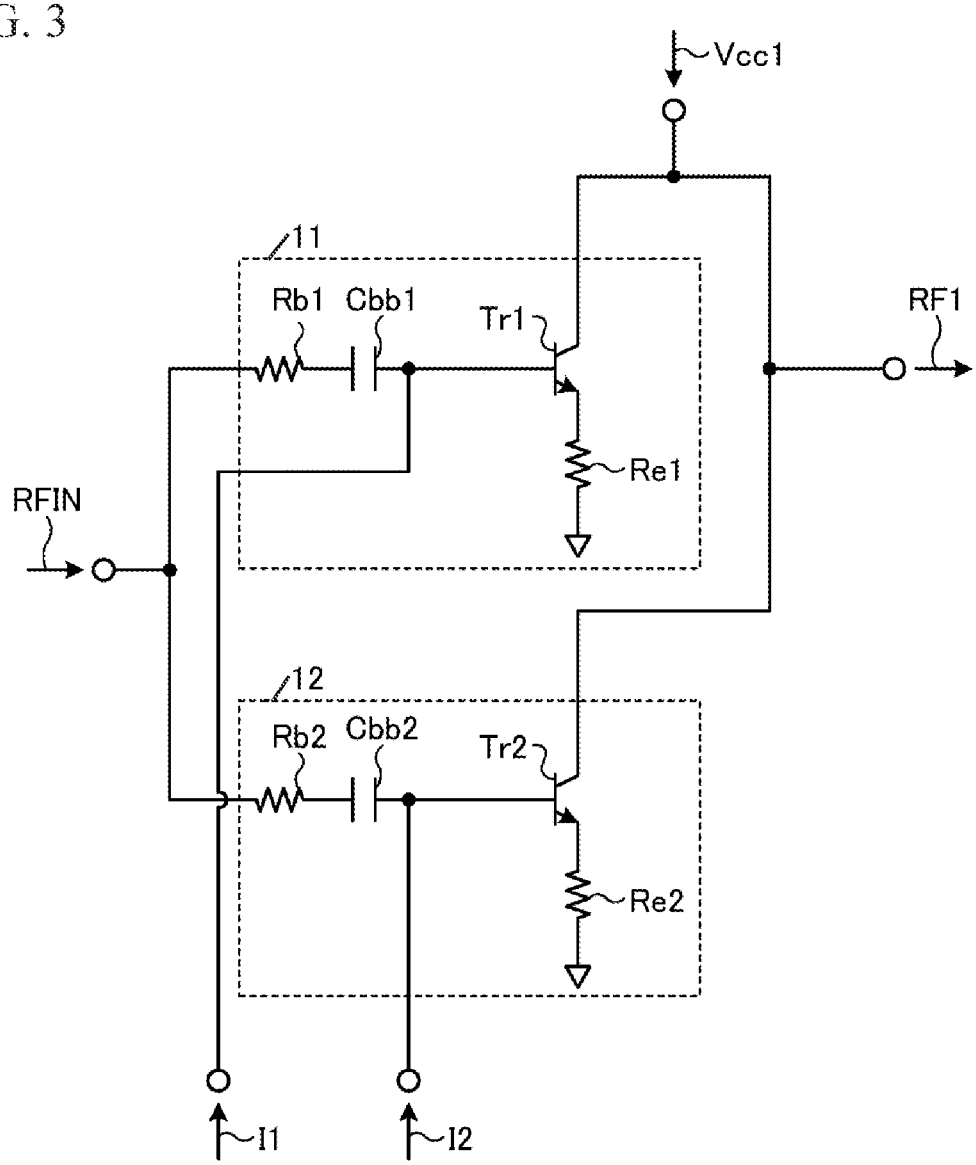
FIG. 3 is a diagram illustrating a first example of circuit configuration of first and second power amplifiers of a power amplifying circuit according to the first embodiment.

FIG. 3 is a diagram illustrating a first example of circuit configuration of the first and second power amplifiers of the power amplifying circuit according to the first embodiment.

The first power amplifier 11 includes resistors Rb1 and Re1, a DC cut capacitor Cbb1, and a transistor Tr1.

The resistor Rb1 receives, at its first end, the radio-frequency input signal RFIN. The resistor Rb1 is connected, at its second end, to a first end of the DC cut capacitor Cbb1 electrically. The DC cut capacitor Cbb1 is connected, at its second end, to the base of the transistor Tr1 electrically.

The transistor Tr1 receives, at its collector, the power supply voltage Vcc1. The transistor Tr1 is connected, at its emitter, to a first end of the resistor Re1 electrically. The resistor Re1 is connected, at its second end, to the reference potential electrically.

The transistor Tr1 receives, at its base, the first bias current I1 through the first resistor Rbb1 (see FIG. 1). The transistor Tr1 receives, at its base, the radio-frequency input signal RFIN which has passed through the resistor Rb1 and the DC cut capacitor Cbb1.

The transistor Tr1 amplifies the radio-frequency input signal RFIN to output the amplified radio frequency signal RF1 from its collector.

The second power amplifier 12 includes resistors Rb2 and Re2, a DC cut capacitor Cbb2, and a transistor Tr2.

The connection relationship between the resistors Rb2 and Re2, the DC cut capacitor Cbb2, and the transistor Tr2 are substantially the same as that of the resistors Rb1 and Re1, the DC cut capacitor Cbb1, and the transistor Tr1, and will not be described.

Adjustment of the resistance values of the resistor Rb1 and the resistor Rb2 or adjustment of the sizes of the transistor Tr1 and the transistor Tr2 enables adjustment of the gain of the first power amplifier 11 and the gain of the second power amplifier 12.

Figure 4:
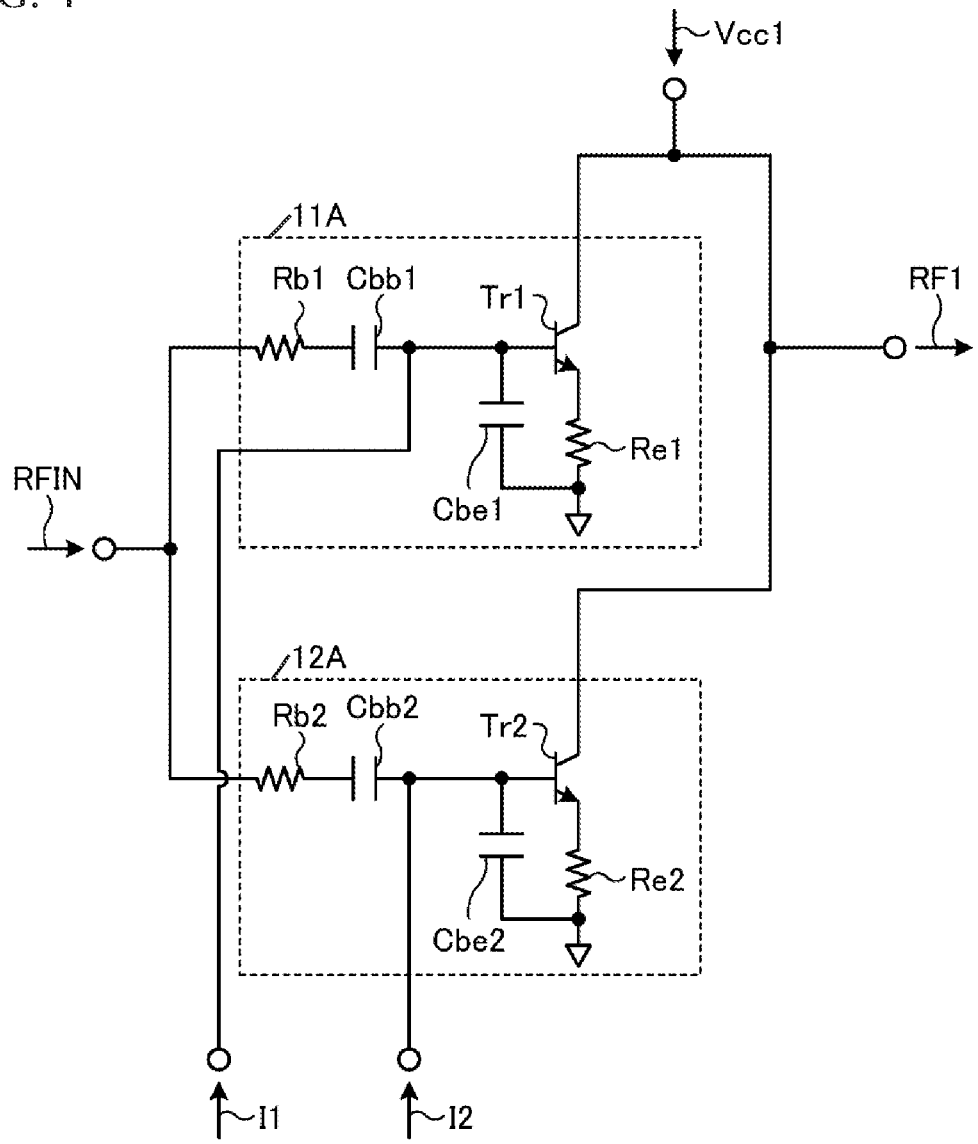
FIG. 4 is a diagram illustrating a second example of circuit configuration of first and second power amplifiers of a power amplifying circuit according to the first embodiment.

FIG. 4 is a diagram illustrating a second example of circuit configuration of the first and second power amplifiers of the power amplifying circuit according to the first embodiment.

Compared with the first power amplifier 11 (see FIG. 3), a first power amplifier 11A further includes a capacitor Cbe1.

The capacitor Cbe1 is connected, at its first end, to the base of the transistor Tr1 electrically. The capacitor Cbe1 is connected, at its second end, to the reference potential electrically.

Compared with the second power amplifier 12 (see FIG. 3), a second power amplifier 12A further includes a capacitor Cbe2.

The connection relationship of the capacitor Cbe2 is substantially the same as that of the capacitor Cbe1, and will not be described.

Figure 5:
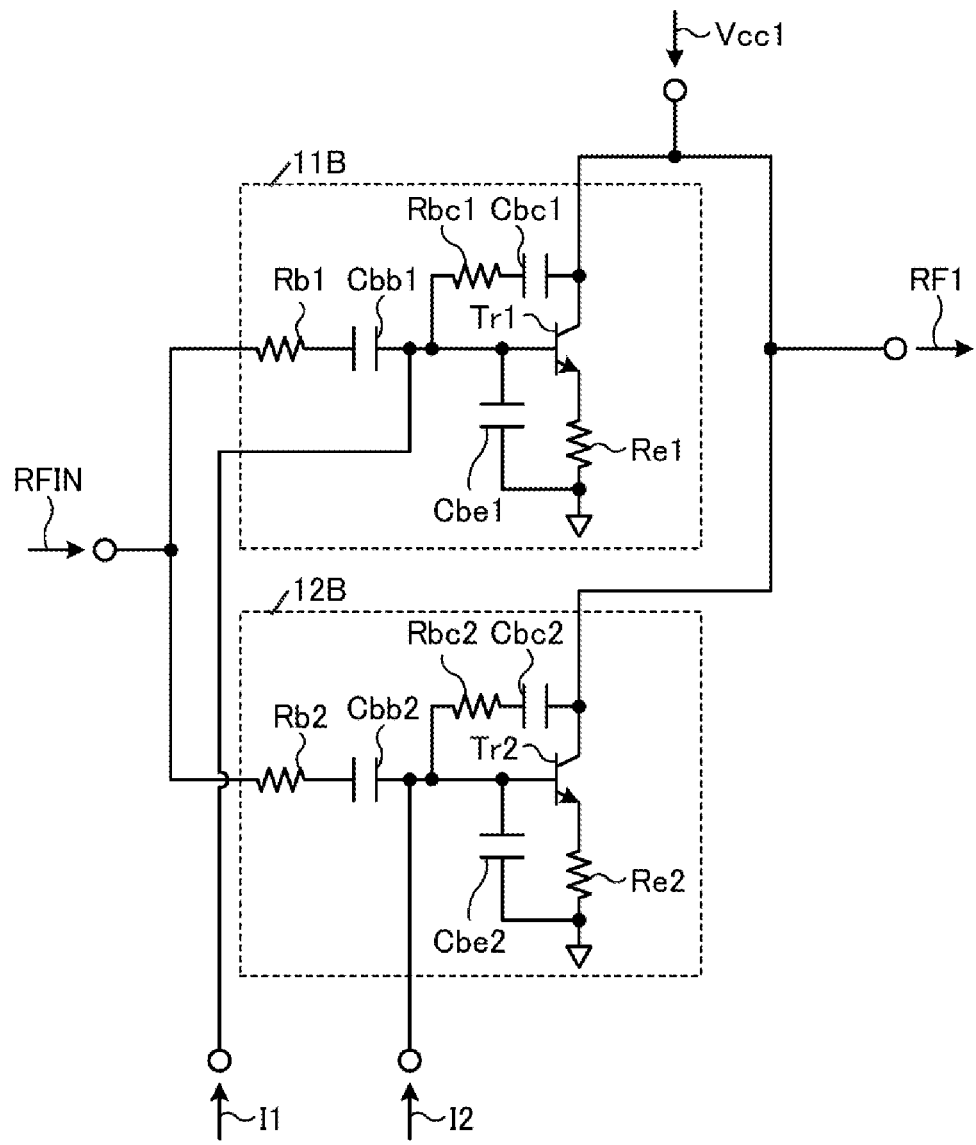
FIG. 5 is a diagram illustrating a third example of circuit configuration of first and second power amplifiers of a power amplifying circuit according to the first embodiment.

FIG. 5 is a diagram illustrating a third example of circuit configuration of the first and second power amplifiers of the power amplifying circuit according to the first embodiment.

Compared with the first power amplifier 11A (see FIG. 4), a first power amplifier 11B further includes a resistor Rbc1 and a capacitor Cbc1.

The resistor Rbc1 is connected, at its first end, to the base of the transistor Tr1 electrically. The resistor Rbc1 is connected, at its second end, to a first end of the capacitor Cbc1 electrically. The capacitor Cbc1 is connected, at its second end, to the collector of the transistor Tr1 electrically.

Compared with the second power amplifier 12A (see FIG. 4), a second power amplifier 12B further includes a resistor Rbc2 and a capacitor Cbc2.

The connection relationship of the resistor Rbc2 and the capacitor Cbc2 is substantially the same as that of the resistor Rbc1 and the capacitor Cbc1, and will not be described.

Figure 6:
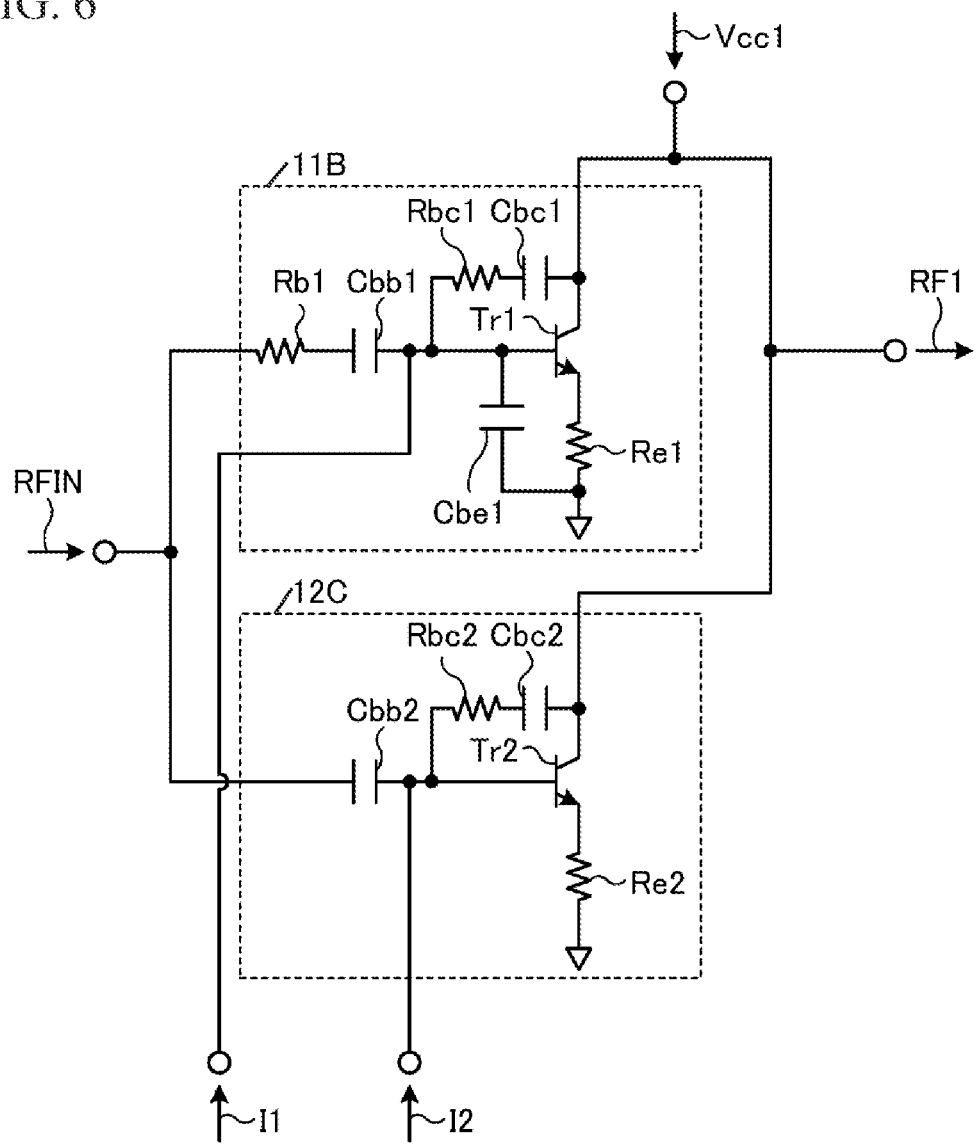
FIG. 6 is a diagram illustrating a fourth example of circuit configuration of first and second power amplifiers of a power amplifying circuit according to the first embodiment.

FIG. 6 is a diagram illustrating a fourth example of circuit configuration of the first and second power amplifiers of the power amplifying circuit according to the first embodiment.

Compared with the second power amplifier 12B (see FIG. 5), a second power amplifier 12C does not include the resistor Rb2. Therefore, the alternating-current input signal RFIN is inputted to the base of the transistor Tr2 only through the DC cut capacitor Cbb2. Compared with the second power amplifier 12B, the second power amplifier 12C does not include the capacitor Cbe2.

FIGS. 3 to 6 illustrate the circuit configurations of the first power amplifiers 11, 11A, and 11B and the second power amplifiers 12, 12A, 12B, and 12C. The circuit configurations of the third power amplifier 13 and the fourth power amplifier 14 are substantially the same as those of the first power amplifiers 11, 11A, and 11B and the second power amplifiers 12, 12A, 12B, and 12C, and will be neither illustrated nor described.

Comparison Example

Figure 7:
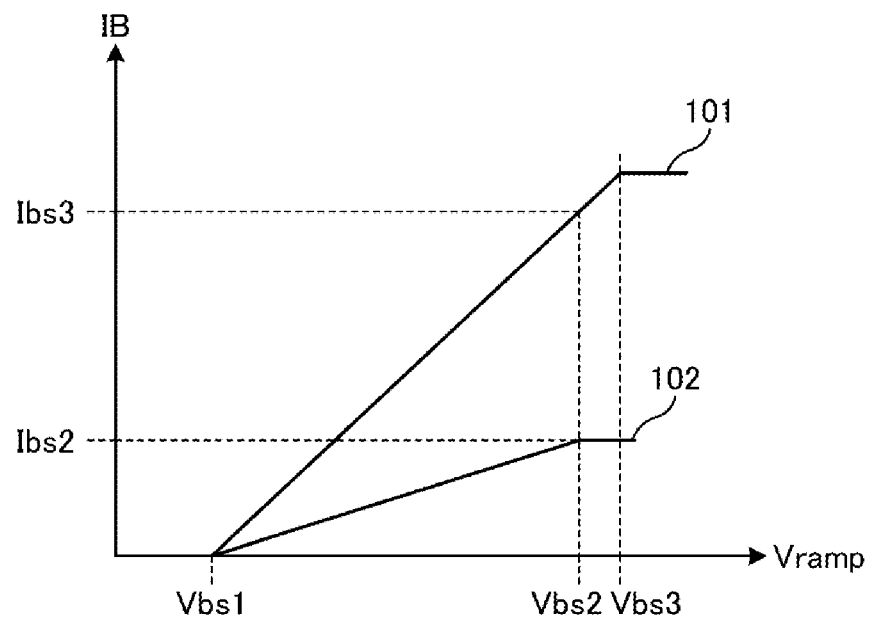
FIG. 7 is a diagram illustrating circuit simulation results according to a comparison example.
Figure 8:
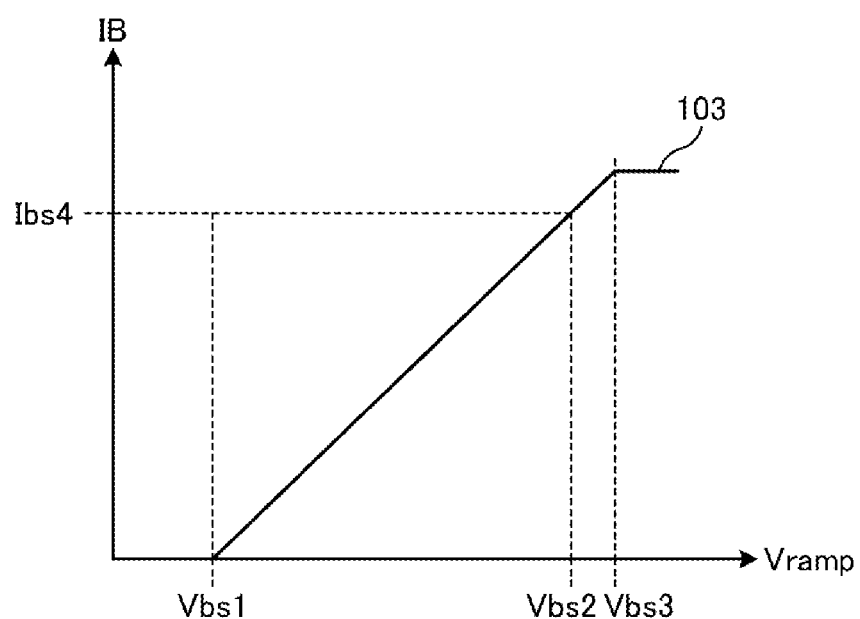
FIG. 8 is a diagram illustrating a circuit simulation result according to the comparison example.

FIGS. 7 and 8 are diagrams illustrating circuit simulation results according to a comparison example. Specifically, FIGS. 7 and 8 are diagrams illustrating the relationship between control voltage and control current. In FIG. 7, a waveform 101 is the waveform of the first control current IB1; a waveform 102 is the waveform of the second control current IB2. In FIG. 8, a waveform 103 is the waveform of the third control current IB3 and the fourth control current IB4.

As illustrated by the waveform 101, the first current output unit 31 sets the first control current IB1 to zero when the control voltage Vramp is less than a predetermined threshold voltage Vbs1. The first current output unit 31 outputs the first control current IB1, which increases linearly in accordance with the control voltage Vramp, to the first bias circuit 15 when the control voltage Vramp is equal to or greater than the threshold voltage Vbs1 and less than a predetermined threshold voltage Vbs3.

The first current output unit 31 outputs the first control current IB1, having a predetermined current value Ibs3, to the first bias circuit 15 when the control voltage Vramp is equal to a predetermined threshold voltage Vbs2. The first current output unit 31 outputs the first control current IB1, having a predetermined constant value, to the first bias circuit 15 when the control voltage Vramp is equal to or greater than the threshold voltage Vbs3.

In this example, Vbs1<Vbs2<Vbs3. The threshold voltage Vbs1 may be 0 V or may be other than 0 V.

As illustrated by the waveform 102, the second current output unit 32 sets the second control current IB2 to zero when the control voltage Vramp is less than the threshold voltage Vbs1. The second current output unit 32 outputs the second control current IB2, which increases linearly in accordance with the control voltage Vramp, to the second bias circuit 16 when the control voltage Vramp is equal to or greater than the threshold voltage Vbs1 and less than the threshold voltage Vbs2. The second current output unit 32 outputs the second control current IB2, having a predetermined current value Ibs2, to the second bias circuit 16 when the control voltage Vramp is equal to or greater than the threshold voltage Vbs2.

In this example, Ibs2<Ibs3.

As illustrated by the waveform 103, the third current output unit 33 and the fourth current output unit 34 set the third control current IB3 and the fourth control current IB4 to zero when the control voltage Vramp is less than the threshold voltage Vbs1. The third current output unit 33 and the fourth current output unit 34 output the third control current IB3 and the fourth control current IB4, which increase linearly in accordance with the control voltage Vramp, to the third bias circuit 17 and the fourth bias circuit 18, respectively, when the control voltage Vramp is equal to or greater than the threshold voltage Vbs1 and less than the threshold voltage Vbs3.

The third current output unit 33 and the fourth current output unit 34 output the third control current IB3 and the fourth control current IB4, which have a predetermined current value Ibs4, to the third bias circuit 17 and the fourth bias circuit 18, respectively, when the control voltage Vramp is equal to the threshold voltage Vbs2. The third current output unit 33 and the fourth current output unit 34 output the third control current IB3 and the fourth control current IB4, which have a predetermined constant value, to the third bias circuit 17 and the fourth bias circuit 18, respectively, when the control voltage Vramp is equal to or greater than the threshold voltage Vbs3.

Figure 9:
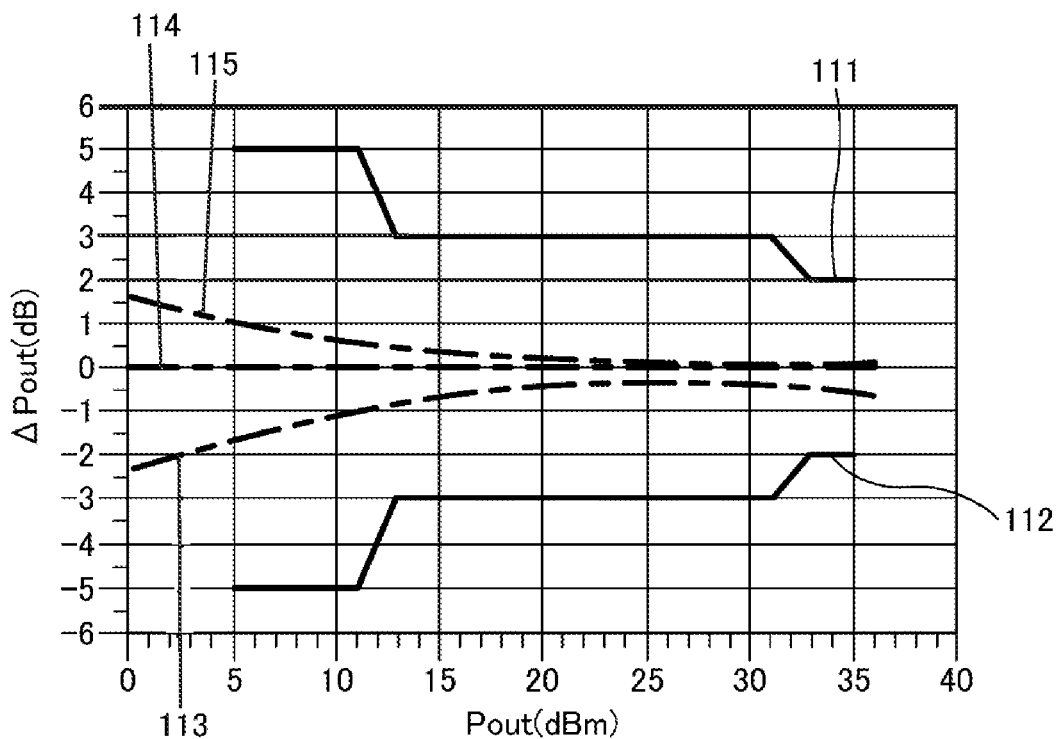
FIG. 9 is a diagram illustrating circuit simulation results according to the comparison example.

FIG. 9 is a diagram illustrating circuit simulation results according to the comparison example. Specifically, FIG. 9 is a diagram illustrating the relationship between alternating-current output power and the amount of change of the alternating-current output power, according to the comparison example. In FIG. 9, a waveform 111 illustrates, for example, the upper limit defined by the specification of GSM; a waveform 112 illustrates, for example, the lower limit defined by the specification of GSM.

A waveform 113 illustrates the relationship between the output power Pout and the change amount ΔPout of the output power Pout, which is obtained when an input power Pin is −1 dBm. A waveform 114 illustrates the relationship between the output power Pout and the change amount ΔPout, which is obtained when the input power Pin is 2.5 dBm. A waveform 115 illustrates the relationship between the output power Pout and the change amount ΔPout, which is obtained when the input power Pin is 6 dBm.

The waveforms 113 to 115 are located between the waveform 111 and the waveform 112. However, for example, if fluctuations of the change amount ΔPout, which are caused by fluctuations of the temperature of the power amplifying circuit 1, or fluctuations of the alternating-current output power, which are caused by upstream and downstream circuits of the power amplifying circuit 1, are considered, it is preferable that the change amount ΔPout be further decreased.

Figure 10:
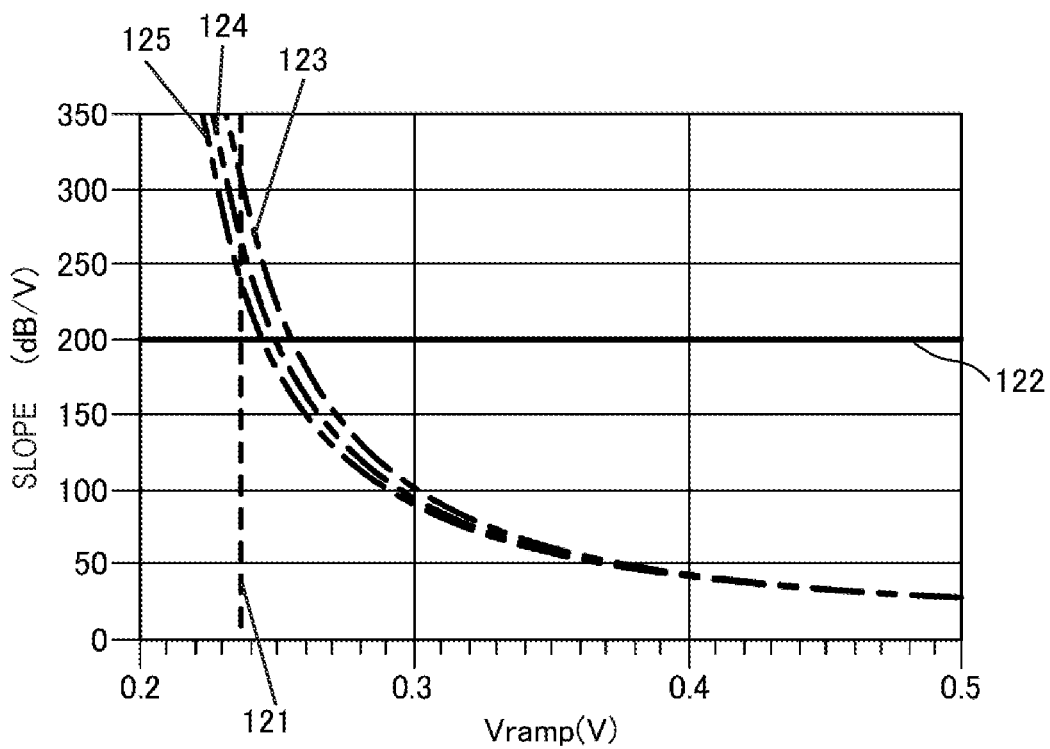
FIG. 10 is a diagram illustrating circuit simulation results according to the comparison example.

FIG. 10 is a diagram illustrating circuit simulation results according to the comparison example. Specifically, FIG. 10 is a diagram illustrating the relationship between control voltage and slope, according to the comparison example. As described above, in the present disclosure, the slope refers to the rate of change of the gain with respect to the control voltage.

In FIG. 10, a line 121 illustrates the control voltage Vramp used when the output power Pout is 5 dBm. A line 122 illustrates the slope value (for example, 200 dB/V) which is a target. A waveform 123 illustrates the relationship between the control voltage Vramp and the slope, which is obtained when the input power Pin is −1 dBm. A waveform 124 illustrates the relationship between the control voltage Vramp and the slope, which is obtained when the input power Pin is 2.5 dBm. A waveform 125 illustrates the relationship between the control voltage Vramp and the slope, which is obtained when the input power Pin is 6 dBm.

As illustrated by the waveforms 123 to 125, when the output power Pout is 5 dBm, the slope values exceed the target.

As described above, when the radio-frequency output signal RFOUT is low-power, the comparison example has disadvantages that the radio-frequency output signal RFOUT has large dependency on the radio-frequency input signal RFIN (see FIG. 9) and that the slope is increased (see FIG. 10).

First Embodiment

Figure 11:
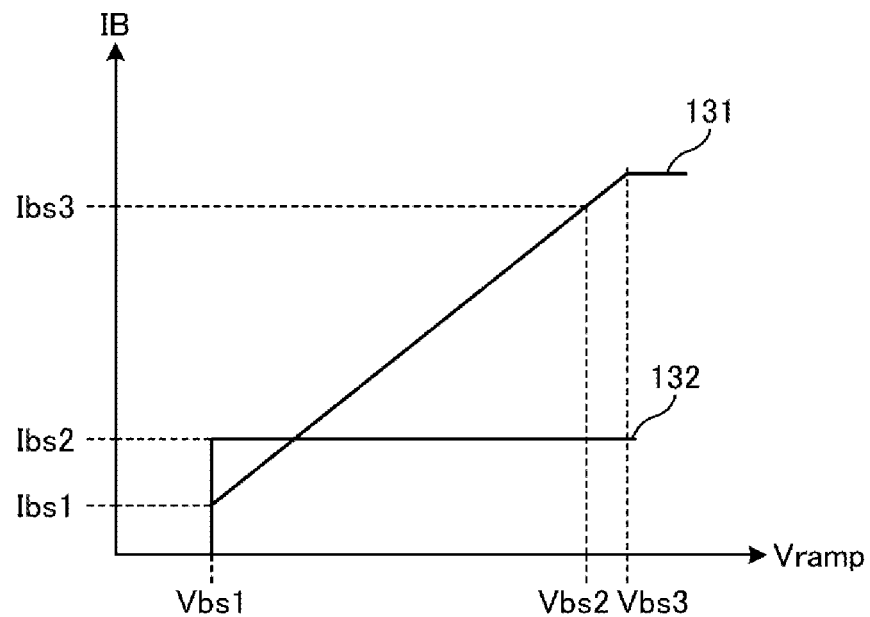
FIG. 11 is a diagram illustrating circuit simulation results according to the first embodiment.
Figure 12:
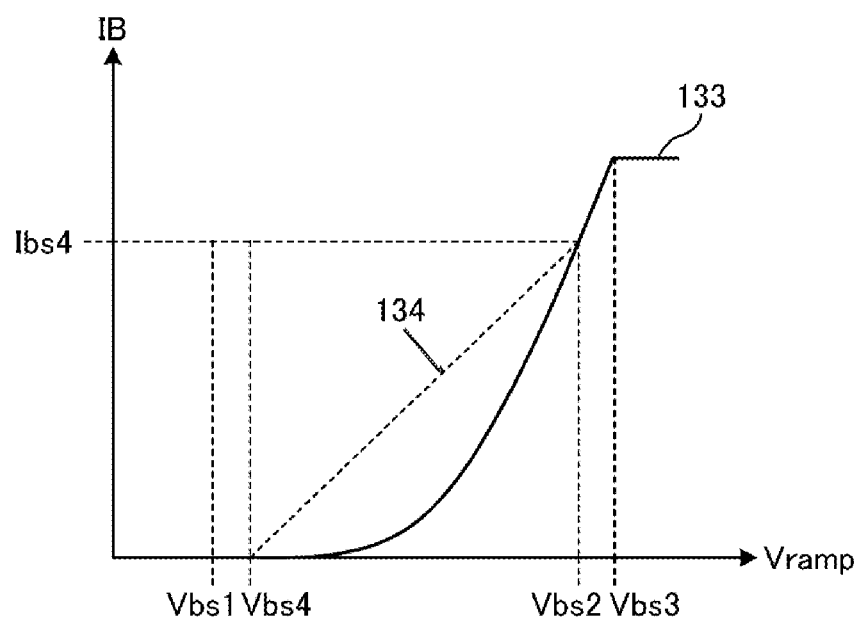
FIG. 12 is a diagram illustrating a circuit simulation result according to the first embodiment.

FIGS. 11 and 12 are diagrams illustrating circuit simulation results according to the first embodiment. Specifically, FIGS. 11 and 12 are diagrams illustrating the relationship between control voltage and control current, according to the first embodiment. In FIG. 11, a waveform 131 is the waveform of the first control current IB1; a waveform 132 is the waveform of the second control current IB2. In FIG. 12, a waveform 133 is the waveform of the third control current IB3 and the fourth control current IB4.

As illustrated by the waveform 131, the first current output unit 31 sets the first control current IB1 to zero when the control voltage Vramp is less than the threshold voltage Vbs1. The first current output unit 31 outputs the first control current IB1, having a predetermined current value Ibs1, to the first bias circuit 15 when the control voltage Vramp is equal to a threshold voltage Vbs1.

The threshold voltage Vbs1 corresponds to an exemplary "first threshold voltage" in the present disclosure. The current value Ibs1 corresponds to an exemplary "first current value" in the present disclosure.

The first current output unit 31 outputs the first control current IB1, which increases linearly in accordance with the control voltage Vramp, to the first bias circuit 15 when the control voltage Vramp is greater than the threshold voltage Vbs1 and less than the threshold voltage Vbs3. The first current output unit 31 outputs the first control current IB1, having the current value Ibs3, to the first bias circuit 15 when the control voltage Vramp is equal to the threshold voltage Vbs2. The first current output unit 31 outputs the first control current IB1, having a predetermined constant value, to the first bias circuit 15 when the control voltage Vramp is equal to or greater than the threshold voltage Vbs3.

In this example, it is assumed that Ibs1≤Ibs2. However, the present disclosure is not limited to this. A condition, Ibs1>Ibs2, may be used.

As illustrated by the waveform 132, the second current output unit 32 sets the second control current IB2 to zero when the control voltage Vramp is less than the threshold voltage Vbs1. The second current output unit 32 outputs the second control current IB2, having the current value Ibs2, to the second bias circuit 16 when the control voltage Vramp is equal to or greater than the threshold voltage Vbs1.

The current value Ibs2 corresponds to an exemplary "second current value" in the present disclosure.

Compared with the waveforms 101 and 102 (see FIG. 7), the waveforms 131 and 132 indicate that the first control current IB1 and the second control current IB2 are larger in a range in which the control voltage Vramp is low (for example, the threshold voltage Vbs1). That is, compared with the comparison example, the first embodiment achieves the first-stage power amplifier having a larger gain when the radio-frequency output signal RFOUT is low-power.

As illustrated by the waveform 133, the third current output unit 33 and the fourth current output unit 34 set the third control current IB3 and the fourth control current IB4 to zero when the control voltage Vramp is less than a predetermined threshold voltage Vbs4. The third current output unit 33 and the fourth current output unit 34 output the third control current IB3 and the fourth control current IB4, which are proportional to the square of the control voltage Vramp, to the third bias circuit 17 and the fourth bias circuit 18, respectively, when the control voltage Vramp is equal to or greater than the threshold voltage Vbs4 and less than the threshold voltage Vbs3.

In this example, it is assumed that Vbs1<Vbs4.

The threshold voltage Vbs4 corresponds to exemplary "second threshold voltage" and "third threshold voltage". In the first embodiment, the second threshold voltage and the third threshold voltage are the same threshold voltage Vbs4. However, these may be different from each other. In other words, the threshold voltage for the third current output unit 33 may be different from the threshold voltage for the fourth current output unit 34. At the threshold voltage for the third current output unit 33, the third current output unit 33 starts to output the third control current IB3 proportional to the square of the control voltage Vramp. At the threshold voltage for the fourth current output unit 34, the fourth current output unit 34 starts to output the fourth control current IB4 proportional to the square of the control voltage Vramp.

The third current output unit 33 and the fourth current output unit 34 output the third control current IB3 and the fourth control current IB4, which have the current value Ibs4, to the third bias circuit 17 and the third bias circuit 17, respectively, when the control voltage Vramp is equal to the threshold voltage Vbs2. The third current output unit 33 and the fourth current output unit 34 output the third control current IB3 and the fourth control current IB4, which have a predetermined constant value, to the third bias circuit 17 and the fourth bias circuit 18, respectively, when the control voltage Vramp is equal to or greater than the threshold voltage Vbs3.

Compared with the waveform 103 (see FIG. 8), the waveform 133 indicates that the third control current IB3 and the fourth control current IB4 are smaller in a range in which the control voltage Vramp is low (for example, from the threshold voltage Vbs1 to the threshold voltage Vbs4). That is, compared with the comparison example, the first embodiment achieves the second-stage and third-stage power amplifiers having a smaller gain when the radio-frequency output signal RFOUT is low-power.

Figure 13:
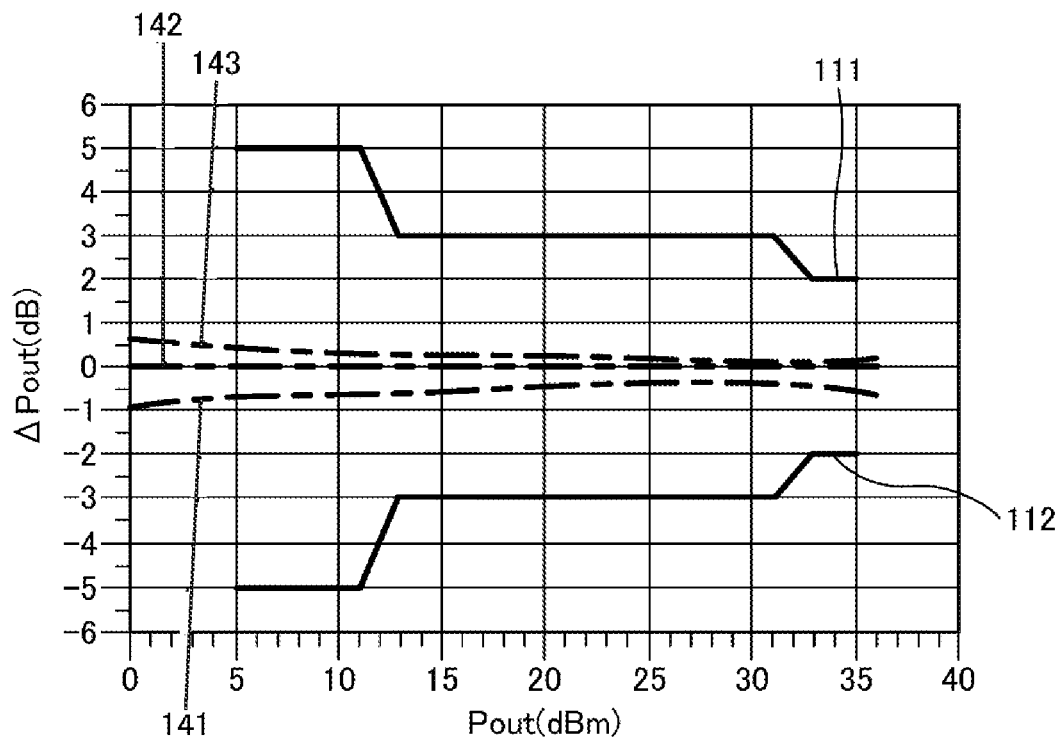
FIG. 13 is a diagram illustrating circuit simulation results according to the first embodiment.

FIG. 13 is a diagram illustrating circuit simulation results according to the first embodiment. Specifically, FIG. 13 is a diagram illustrating the relationship between alternating-current output power and the amount of change of the alternating-current output power, according to the first embodiment. In FIG. 13, a waveform 141 illustrates the relationship between the output power Pout and the change amount ΔPout of the output power Pout, which is obtained when the input power Pin is −1 dBm; a waveform 142 illustrates the relationship between the output power Pout and the change amount ΔPout, which is obtained when the input power Pin is 2.5 dBm; a waveform 143 illustrates the relationship between the output power Pout and the change amount ΔPout, which is obtained when the input power Pin is 6 dBm.

Comparison of the waveforms 141 to 143 in FIG. 13 with the waveforms 113 to 115 in FIG. 9 shows that the first embodiment achieves the change amount ΔPout smaller than that of the comparison example.

Figure 14:
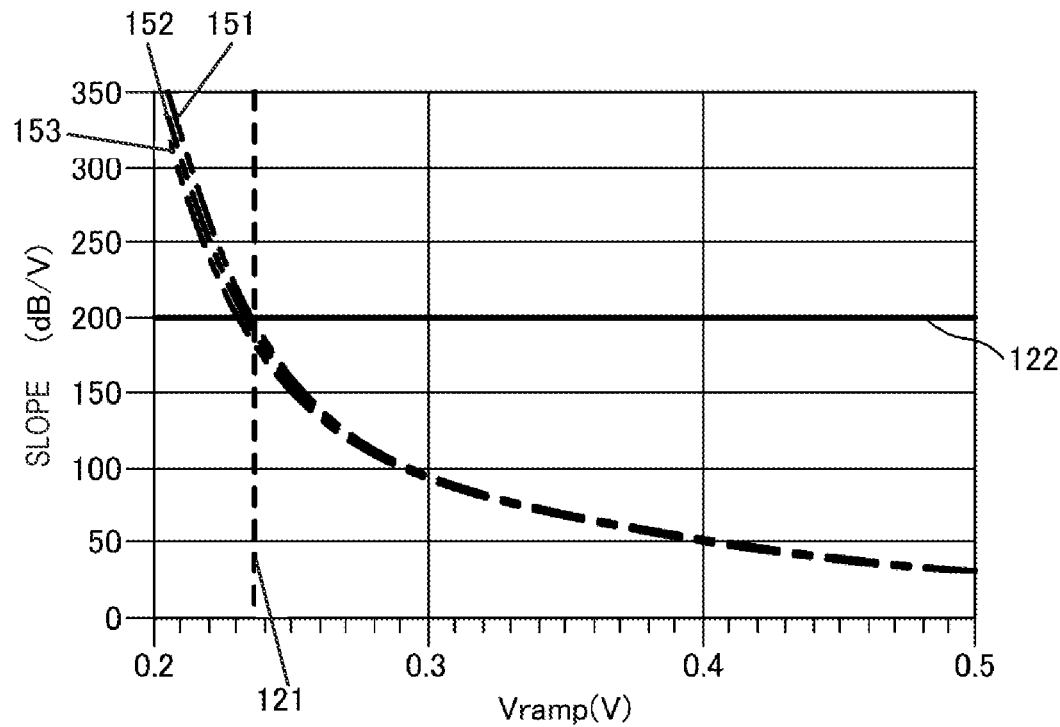
FIG. 14 is a diagram illustrating circuit simulation results according to the first embodiment.

FIG. 14 is a diagram illustrating circuit simulation results according to the first embodiment. Specifically, FIG. 14 is a diagram illustrating the relationship between the control voltage and the slope, according to the first embodiment. In FIG. 14, a waveform 151 illustrates the relationship between the control voltage Vramp and the slope, which is obtained when the input power Pin is −1 dBm; a waveform 152 illustrates the relationship between the control voltage Vramp and the slope, which is obtained when the input power Pin is 2.5 dBm; a waveform 153 illustrates the relationship between the control voltage Vramp and the slope, which is obtained when the input power Pin is 6 dBm.

As illustrated by the waveforms 151 to 153, the slope values are less than the target when the output power Pout is 5 dBm.

Effects

Compared with the comparison example, the first embodiment achieves the first-stage power amplifier, having a larger gain, and the second-stage and third-stage power amplifiers, having a smaller gain, when the radio-frequency output signal RFOUT is low-power. Thus, the first embodiment achieves the suppression of the influence exerted by the second-stage and third-stage power amplifiers on the dependency of the radio-frequency output signal RFOUT on the radio-frequency input signal RFIN. That is, the first embodiment achieves the reduction of variations in the radio-frequency output signal RFOUT, which are dependent on the radio-frequency input signal RFIN. The first embodiment also achieves the decrease of the slope.

Modified Example

In the first embodiment, the third current output unit 33 and the fourth current output unit 34 output the third control current IB3 and the fourth control current IB4, respectively, which are illustrated by the waveform 133 (see FIG. 12). However, the present disclosure is not limited to this. One of the current output units, that is, the third current output unit 33 and the fourth current output unit 34, may output the control current illustrated by the waveform 133. The other one of the current output units, that is, the third current output unit 33 and the fourth current output unit 34, may output a control current, which, as illustrated by a waveform 134, increases linearly in accordance with the control voltage Vramp when the control voltage Vramp is equal to or greater than the threshold voltage Vbs4 and less than the threshold voltage Vbs2. Alternatively, the third current output unit 33 and the fourth current output unit 34 may output the third control current IB3 and the fourth control current IB4, respectively, which, as illustrated by the waveform 134, increase linearly in accordance with the control voltage Vramp when the control voltage Vramp is equal to or greater than the threshold voltage Vbs4 and less than the threshold voltage Vbs2.

Second Embodiment

Figure 15:
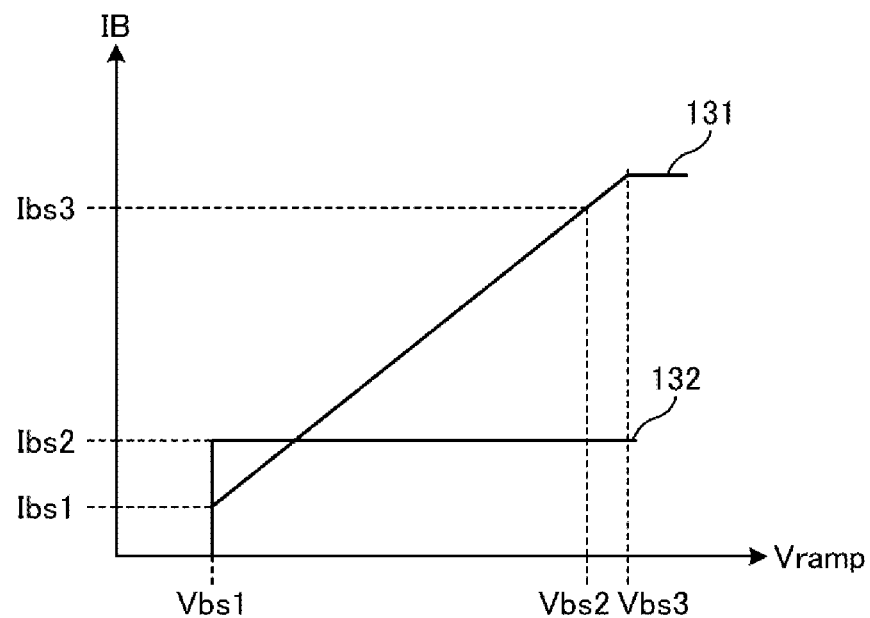
FIG. 15 is a diagram illustrating circuit simulation results according to a second embodiment.
Figure 16:
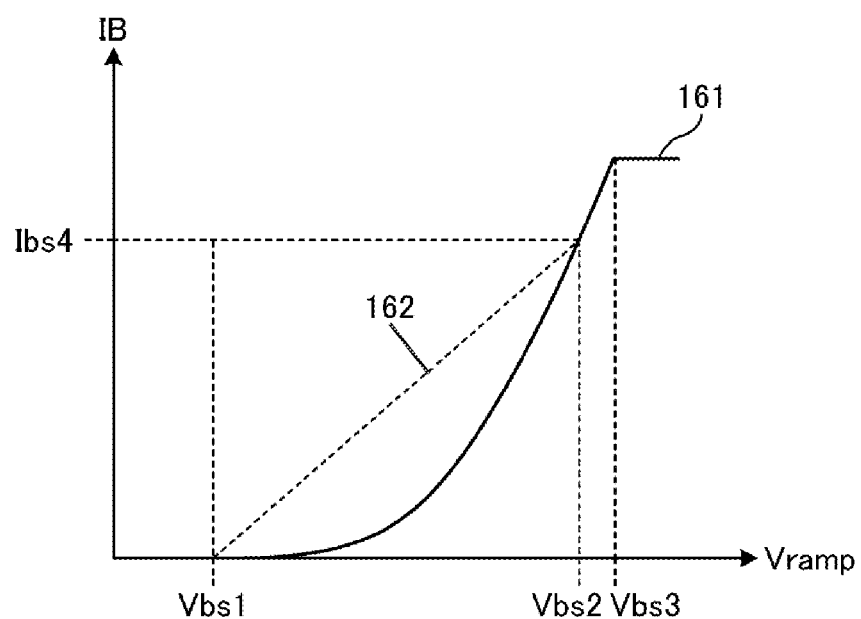
FIG. 16 is a diagram illustrating a circuit simulation result according to the second embodiment.

FIGS. 15 and 16 are diagrams illustrating circuit simulation results according to the second embodiment. Specifically, FIGS. 15 and 16 are diagrams illustrating the relationship between control voltage and control current, according to the second embodiment. In FIG. 15, the waveform 131 is the waveform of the first control current IB1, and is substantially the same as the waveform 131 in FIG. 11. The waveform 132 is the waveform of the second control current IB2, and is substantially the same as the waveform 132 in FIG. 11. In FIG. 16, a waveform 161 is the waveform of the third control current IB3 and the fourth control current IB4.

As illustrated by the waveform 161, the third current output unit 33 and the fourth current output unit 34 set the third control current IB3 and the fourth control current IB4 to zero when the control voltage Vramp is less than the threshold voltage Vbs1. The third current output unit 33 and the fourth current output unit 34 output the third control current IB3 and the fourth control current IB4, which are proportional to the square of the control voltage Vramp, to the third bias circuit 17 and the fourth bias circuit 18, respectively, when the control voltage Vramp is equal to or greater than the threshold voltage Vbs1 and less than the threshold voltage Vbs3.

The third current output unit 33 and the fourth current output unit 34 output the third control current IB3 and the fourth control current IB4, which have the current value Ibs4, to the third bias circuit 17 and the fourth bias circuit 18, respectively, when the control voltage Vramp is equal to the threshold voltage Vbs2. The third current output unit 33 and the fourth current output unit 34 output the third control current IB3 and the fourth control current IB4, which have a predetermined constant value, to the third bias circuit 17 and the fourth bias circuit 18, respectively, when the control voltage Vramp is equal to or greater than the threshold voltage Vbs3.

Effects

Compared with the comparison example, the second embodiment achieves the first-stage power amplifier, having a larger gain, and the second-stage and third-stage power amplifiers, having a smaller gain, when the radio-frequency output signal RFOUT is low-power. Thus, the second embodiment achieves the suppression of the influence exerted by the second-stage and third-stage power amplifiers on the dependency of the radio-frequency output signal RFOUT on the radio-frequency input signal RFIN. That is, the second embodiment achieves the reduction of variations in the radio-frequency output signal RFOUT, which are dependent on the radio-frequency input signal RFIN. The second embodiment also achieves the decrease of the slope.

Modified Example

In the second embodiment, the third current output unit 33 and the fourth current output unit 34 output the third control current IB3 and the fourth control current IB4, respectively, which are illustrated by the waveform 161 (see FIG. 16). However, the present disclosure is not limited to this. One of the current output units, that is, the third current output unit 33 and the fourth current output unit 34, may output the control current illustrated by the waveform 161. The other one of the current output units, that is, the third current output unit 33 and the fourth current output unit 34, may output the control current, which, as illustrated by a waveform 162, increases linearly in accordance with the control voltage Vramp when the control voltage Vramp is equal to or greater than the threshold voltage Vbs1 and less than the threshold voltage Vbs2.

Third Embodiment

Figure 17:
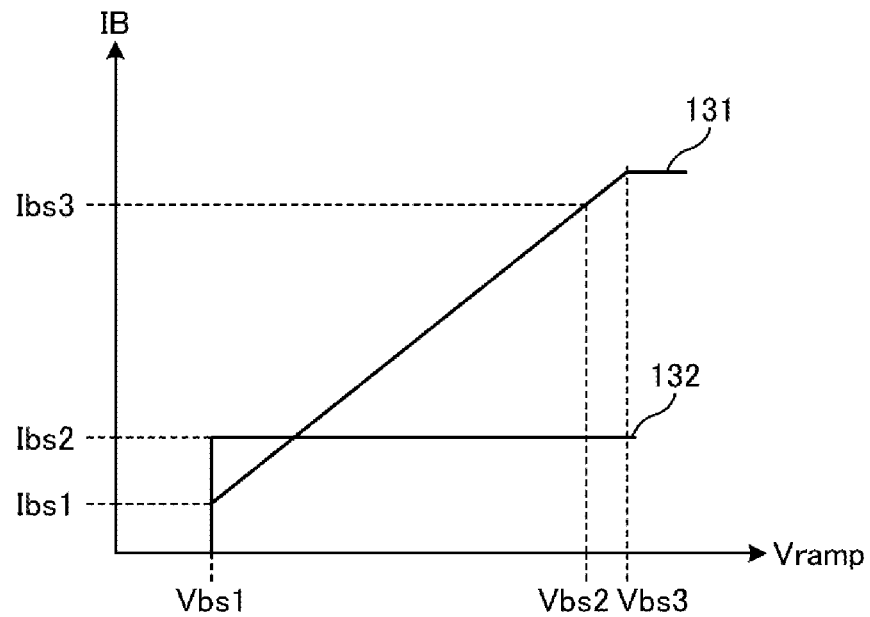
FIG. 17 is a diagram illustrating circuit simulation results according to a third embodiment.
Figure 18:
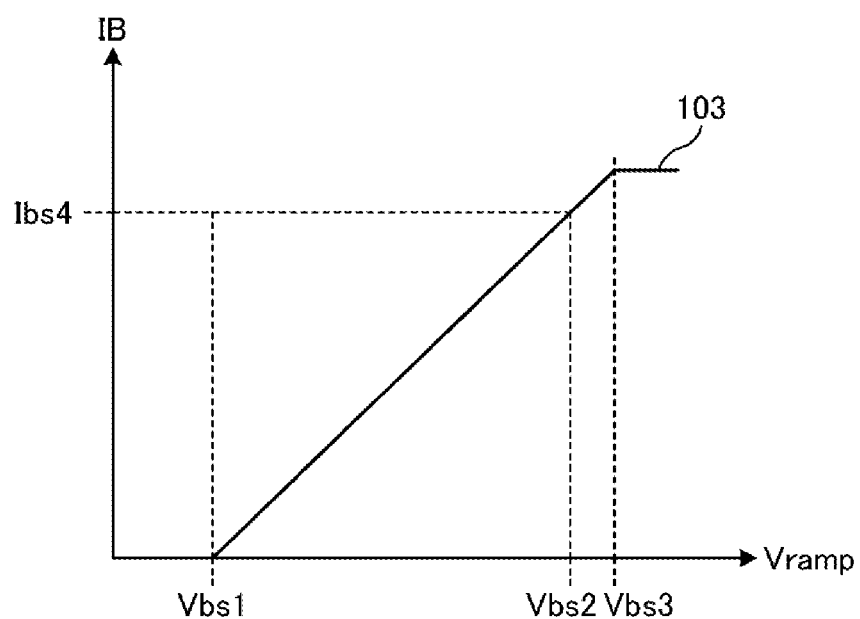
FIG. 18 is a diagram illustrating a circuit simulation result according to the third embodiment.

FIGS. 17 and 18 are diagrams illustrating circuit simulation results according to a third embodiment. Specifically, FIGS. 17 and 18 are diagrams illustrating the relationship between control voltage and control current, according to the third embodiment. In FIG. 17, the waveform 131 is the waveform of the first control current IB1, and is substantially the same as the waveform 131 in FIG. 11. The waveform 132 is the waveform of the second control current IB2, and is substantially the same as the waveform 132 in FIG. 11. In FIG. 18, the waveform 103 is the waveform of the third control current IB3 and the fourth control current IB4, and is substantially the same as the waveform 103 in FIG. 8.

Figure 19:
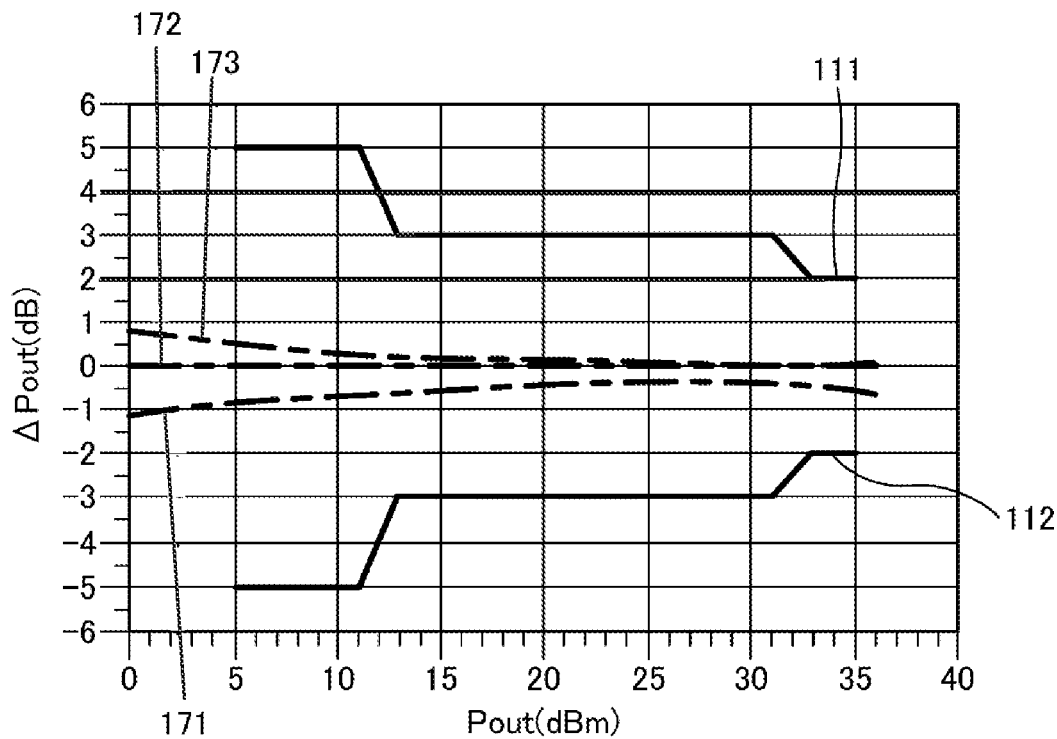
FIG. 19 is a diagram illustrating circuit simulation results according to the third embodiment.

FIG. 19 is a diagram illustrating circuit simulation results according to the third embodiment. Specifically, FIG. 19 is a diagram illustrating the relationship between alternating-current output power and the amount of change of the alternating-current output power, according to the third embodiment. In FIG. 19, a waveform 171 illustrates the relationship between the output power Pout and the change amount ΔPout of the output power Pout, which is obtained when the input power Pin is −1 dBm. A waveform 172 illustrates the relationship between the output power Pout and the change amount ΔPout, which is obtained when the input power Pin is 2.5 dBm. A waveform 173 illustrates the relationship between the output power Pout and the change amount ΔPout, which is obtained when the input power Pin is 6 dBm.

Comparison of the waveforms 171 to 173 in FIG. 19 with the waveforms 113 to 115 in FIG. 9 shows that the third embodiment achieves the change amount ΔPout smaller than that of the comparison example.

Figure 20:
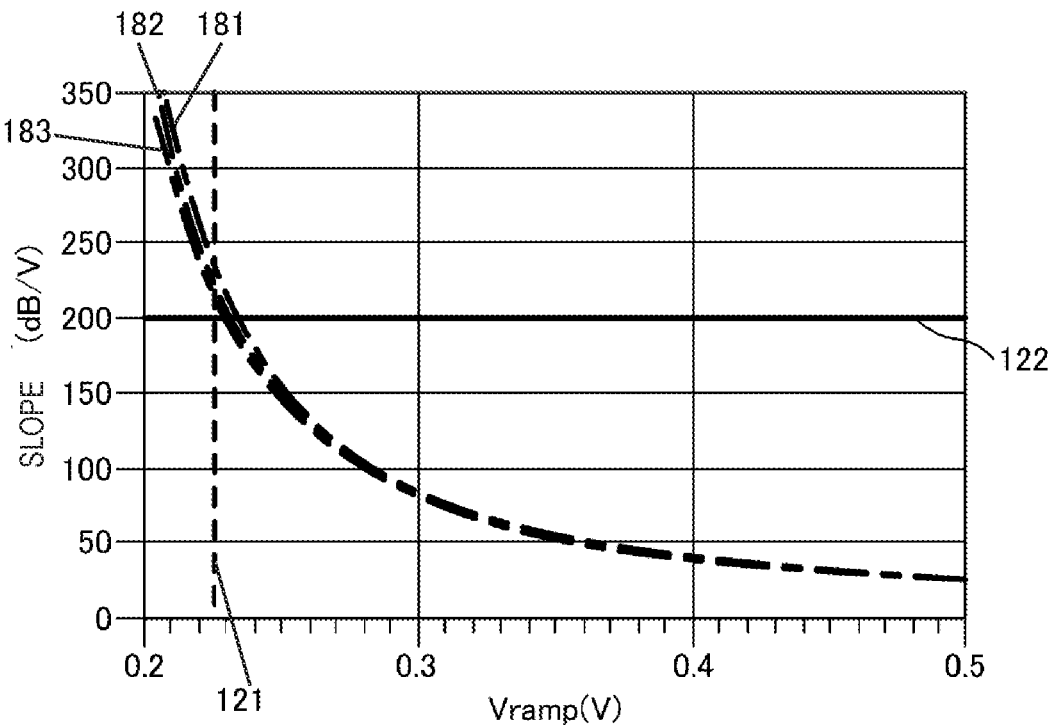
FIG. 20 is a diagram illustrating circuit simulation results according to the third embodiment.

FIG. 20 is a diagram illustrating circuit simulation results according to the third embodiment. Specifically, FIG. 20 is a diagram illustrating the relationship between the control voltage and the slope, according to the third embodiment. In FIG. 20, a waveform 181 illustrates the relationship between the control voltage Vramp and the slope, which is obtained when the input power Pin is −1 dBm; a waveform 182 illustrates the relationship between the control voltage Vramp and the slope, which is obtained when the input power Pin is 2.5 dBm; a waveform 183 illustrates the relationship between the control voltage Vramp and the slope, which is obtained when the input power Pin is 6 dBm.

Comparison of the waveforms 181 to 183 with the waveforms 123 to 125 in FIG. 10 shows that the third embodiment achieves smaller slope values when the output power Pout is 5 dBm.

Effects

Compared with the comparison example, the third embodiment achieves the first-stage power amplifier having a larger gain when the radio-frequency output signal RFOUT is low-power. Thus, the third embodiment enables influence, which is exerted by the second-stage and third-stage power amplifiers on the dependency of the radio-frequency output signal RFOUT on the radio-frequency input signal RFIN, to be made relatively smaller than that exerted by the first-stage power amplifier. Therefore, the third embodiment achieves the reduction of variations in the radio-frequency output signal RFOUT, which are dependent on the radio-frequency input signal RFIN. The third embodiment also achieves the decrease of the slope.

The embodiments described above are made for facilitation of the understanding of the present disclosure, not for limited interpretation of the present disclosure. The present disclosure may be changed/improved without departing from the gist of the disclosure. The present disclosure encompasses its equivalents.

What is claimed is:

1. A power amplifying circuit comprising:
    a plurality of power amplifiers that are connected in stages;
    a plurality of bias circuits that are configured to output a plurality of bias currents to the plurality of respective power amplifiers based on a plurality of corresponding control currents; and
    a control circuit that is configured to output the plurality of control currents to the plurality of bias circuits based on a control voltage,
    wherein the plurality of power amplifiers comprises a first power amplifier and a second power amplifier that are connected in parallel electrically, the first and second power amplifiers being in a first of the stages,
    wherein the plurality of bias circuits comprises:
        a first bias circuit that is configured to output a first bias current to the first power amplifier based on a first control current, and
        a second bias circuit that is configured to output a second bias current to the second power amplifier based on a second control current, and
    wherein the control circuit comprises:
        a first current output circuit that is configured to output the first control current to the first bias circuit, the first control current having a first current value when the control voltage is a first threshold voltage, the first control current increasing linearly in accordance with the control voltage when the control voltage is greater than the first threshold voltage, and
        a second current output circuit that is configured to output the second control current to the second bias circuit, the second control current having a second constant current value when the control voltage is equal to or greater than the first threshold voltage.

2. The power amplifying circuit according to claim 1, wherein the plurality of power amplifiers further comprises:
    a third power amplifier that is connected to an output of the first power amplifier and an output of the second power amplifier, the third power amplifier being in a second of the stages, and
    a fourth power amplifier that is connected to an output of the third power amplifier, the fourth power amplifier being in a third of the stages,
wherein the plurality of bias circuits further comprises:
    a third bias circuit that is configured to output a third bias current to the third power amplifier based on a third control current, and
    a fourth bias circuit that is configured to output a fourth bias current to the fourth power amplifier based on a fourth control current, and
wherein the control circuit further comprises a third current output circuit and a fourth current output circuit, the third current output circuit and the fourth current output circuit being configured to output the third control current and the fourth control current to the third bias circuit and the fourth bias circuit, respectively, when the control voltage is equal to or greater than a second threshold voltage, the second threshold voltage being higher than the first threshold voltage, the third control current and the fourth control current being each proportional to a square of the control voltage.

3. The power amplifying circuit according to claim 1, wherein the plurality of power amplifiers further comprises:
    a third power amplifier that is connected to an output of the first power amplifier and an output of the second power amplifier, the third power amplifier being in a second of the stages, and
    a fourth power amplifier that is connected to an output of the third power amplifier, the fourth power amplifier being in a third of the stages,
wherein the plurality of bias circuits further comprises:
    a third bias circuit that is configured to output a third bias current to the third power amplifier based on a third control current, and
    a fourth bias circuit that is configured to output a fourth bias current to the fourth power amplifier based on a fourth control current, and
wherein the control circuit further comprises a third current output circuit and a fourth current output circuit that are configured to output the third control current and the fourth control current to the third bias circuit and the fourth bias circuit, respectively, when the control voltage is equal to or greater than the first threshold voltage, the third control current and the fourth control current being each proportional to a square of the control voltage.

4. The power amplifying circuit according to claim 1, wherein the plurality of power amplifiers further comprises:
    a third power amplifier that is connected to an output of the first power amplifier and an output of the second power amplifier, the third power amplifier being in a second of the stages, and
    a fourth power amplifier that is connected to an output of the third power amplifier, the fourth power amplifier in a third of the stages,
wherein the plurality of bias circuits further comprises:

a third bias circuit that is configured to output a third bias current to the third power amplifier based on a third control current, and
a fourth bias circuit that is configured to output a fourth bias current to the fourth power amplifier based on a fourth control current, and
wherein the control circuit further comprises a third current output circuit and a fourth current output circuit that are configured to output the third control current and the fourth control current to the third bias circuit and the fourth bias circuit, respectively, when the control voltage is equal to or greater than the first threshold voltage, the third control current and the fourth control current each increasing linearly in accordance with the control voltage.

5. The power amplifying circuit according to claim 1,
wherein the plurality of power amplifiers further comprises:
a third power amplifier that is connected to an output of the first power amplifier and an output of the second power amplifier, the third power amplifier being in a second of the stages, and
a fourth power amplifier that is connected to an output of the third power amplifier, the fourth power amplifier being in a third of the stages,
wherein the plurality of bias circuits further comprises:
a third bias circuit that is configured to output a third bias current to the third power amplifier based on a third control current, and
a fourth bias circuit that is configured to output a fourth bias current to the fourth power amplifier based on a fourth control current,
wherein the control circuit further comprises:
a third current output circuit that is configured to output the third control current to the third bias circuit, and
a fourth current output circuit that is configured to output the fourth control current to the fourth bias circuit,
wherein, when the control voltage is equal to or greater than a second threshold voltage, the second threshold voltage being higher than the first threshold voltage, the third current output circuit or the fourth current output circuit is configured to output a control current that is proportional to a square of the control voltage, and
wherein, when the control voltage is equal to or greater than a third threshold voltage, the third threshold voltage being higher than the first threshold voltage, the other of the third current output circuit or the fourth current output circuit is configured to output a control current that increases linearly in accordance with the control voltage.

6. The power amplifying circuit according to claim 5, wherein the second threshold voltage and the third threshold voltage are identical.

7. The power amplifying circuit according to claim 1,
wherein the plurality of power amplifiers further comprises:
a third power amplifier that is connected to an output of the first power amplifier and an output of the second power amplifier, the third power amplifier being in a second of the stages, and
a fourth power amplifier that is connected to an output of the third power amplifier, the fourth power amplifier being in a third of the stages,
wherein the plurality of bias circuits further comprises:
a third bias circuit that is configured to output a third bias current to the third power amplifier based on a third control current, and
a fourth bias circuit that is configured to output a fourth bias current to the fourth power amplifier based on a fourth control current,
wherein the control circuit further comprises:
a third current output circuit that is configured to output the third control current to the third bias circuit, and
a fourth current output circuit that is configured to output the fourth control current to the fourth bias circuit,
wherein, when the control voltage is equal to or greater than the first threshold voltage, the third current output circuit or the fourth current output circuit is configured to output a control current that is proportional to a square of the control voltage, and
wherein, when the control voltage is equal to or greater than the first threshold voltage, the other of the third current output circuit or the fourth current output circuit is configured to output a control current that increases linearly in accordance with the control voltage.

8. The power amplifying circuit according to claim 1,
wherein the plurality of power amplifiers further comprises:
a third power amplifier that is connected to an output of the first power amplifier and an output of the second power amplifier, the third power amplifier being in a second of the stages, and
a fourth power amplifier that is connected to an output of the third power amplifier, the fourth power amplifier being in a third of the stages,
wherein the plurality of bias circuits further comprises:
a third bias circuit that is configured to output a third bias current to the third power amplifier based on a third control current, and
a fourth bias circuit that is configured to output a fourth bias current to the fourth power amplifier based on a fourth control current,
wherein the control circuit further comprises:
a third current output circuit that is configured to output the third control current to the third bias circuit, and
a fourth current output circuit that is configured to output the fourth control current to the fourth bias circuit, and
wherein, when the control voltage is equal to or greater than a second threshold voltage, the second threshold voltage being higher than the first threshold voltage, the third current output circuit and the fourth current output circuit are configured to output a control current that is proportional to a square of the control voltage or a control current that increases linearly in accordance with the control voltage.

* * * * *